United States Patent [19]

Wright, Jr.

[11] Patent Number: 5,136,618

[45] Date of Patent: Aug. 4, 1992

[54] METHOD AND APPARATUS FOR BANDWIDTH REDUCTION OF MODULATED SIGNALS

[75] Inventor: Laurence E. Wright, Jr., Newport Beach, Calif.

[73] Assignee: Redband Technologies, Inc., Irvine, Calif.

[21] Appl. No.: 300,037

[22] Filed: Jan. 19, 1989

[51] Int. Cl.⁵ .................................... H04B 1/66
[52] U.S. Cl. .................... 375/122; 358/426; 381/29
[58] Field of Search .......... 375/21, 22, 23, 122; 341/63, 64, 87; 381/29, 30, 31; 358/260, 263

[56] References Cited

U.S. PATENT DOCUMENTS

| | | | |
|---|---|---|---|
| 3,725,592 | 4/1973 | Tanaka | 375/122 |
| 3,764,787 | 10/1973 | Yamanaka | 341/64 |
| 3,898,647 | 8/1975 | Morra et al. | 341/64 |
| 3,958,077 | 5/1976 | Ross et al. | 178/6 |
| 4,181,955 | 1/1980 | Mittelman et al. | 364/521 |
| 4,222,076 | 9/1980 | Knowlton | 358/263 |
| 4,277,779 | 7/1981 | Rohrbacher | 375/21 |
| 4,364,026 | 12/1982 | Steckler et al. | 455/179 |
| 4,468,708 | 8/1984 | Coleman, Jr. | 358/310 |
| 4,628,344 | 12/1986 | Glenn | 358/12 |
| 4,633,296 | 12/1986 | Cham et al. | 358/12 |
| 4,672,444 | 6/1987 | Bergen et al. | 358/140 |
| 4,694,336 | 9/1987 | Keesen et al. | 358/133 |
| 4,703,348 | 10/1987 | Yuasa et al. | 358/133 |
| 4,870,685 | 9/1989 | Kadokawa et al. | 375/122 |

Primary Examiner—Stephen Chin
Attorney, Agent, or Firm—Poms, Smith, Lande & Rose

[57] ABSTRACT

A method and apparatus for transmitting and/or storing a modulated signal via a medium whose bandwidth is less than the signal's bandwidth. The modulated signal is first broken into segments or sampled in discrete finite equl increments of time. Within the segment, the analog waveform is converted to digital elemental representations, such as by analog to digital conversion at a predetermined sampling rate, whereupon the analog amplitudes are converted to a sequence of a number of elements of digital numeric values. The quantity or number of elements within the sequence is selected as a function of a pre-selected finite unit of time of the bandwidth of the original modulated signal. An algorithm then processes the sequence to reduce the numerical sequence of the group into a single integer and a key number(s), which is unique to the sequence. These integers are then transmitted, in sequence, in digital form, via low bandwidth mediums. Alternatively, the integers may be stored for subsequent processing. Another matching, or inverse, formula is used to reconstruct the sequence from the integer and key(s), which is then read in order, and in real time, to recreate a representation of the digital waveform. This digital waveform is then converted to an analog modulated signal output.

24 Claims, 2 Drawing Sheets

METHOD AND APPARATUS FOR BANDWIDTH REDUCTION OF MODULATED SIGNALS

BACKGROUND OF THE INVENTION

The background of the invention will be discussed in two parts.

1. Field of the Invention

This invention relates to a method and apparatus for bandwidth reduction, and more particularly, to a method and system for the transmission of high bandwidth signal information (e.g., video, high quality audio, and computer data) via low bandwidth media, such as telephone lines, radio frequencies, or for storage via computer RAM and ROM memories, optical and magnetic storage devices.

2. Description of the Prior Art

The telephone line is one of the most readily available and common methods of communication today. In addition to voice transmission, the telephone line is currently being utilized for data transmission, such as computer binary data. Telephone lines have been limited in transmission speeds, and, although transmission rates over telephone lines have steadily improved, the transmission rate is still not adequate for transmission of high quality images, and more especially, moving images. In many instances, such as with transmission over phone lines of digital data representative of a photograph or the like, the quality of the received image is poor. Improvements have been made in telephone lines by the use of fiberoptics, but fiberoptic use is not sufficiently prevalent at this time.

The most commonly employed method of bandwidth reduction is the time-scan technique, that is, pushing a lot of information through a small-capacity medium a little at a time until it is finally compiled at the receiving end. In the case of video picture phones (and facsimile machines), the prior art shows systems that require nine to thirty seconds to transmit one still picture, which, when received, is frequently subject to picture quality degradation.

U.S. Pat. No. 3,958,077, entitled "Picture Transmission Systems", issued to Ross on May 18, 1976, and discloses a system for transmitting video data in a smaller bandwidth than required for a conventional raster scanned frame, and employs a random or pseudo-random scan of a picture plane. The random scan is obtained in the X and Y directions of the picture plane by two shift registers, an X register and a Y register, connected serially, with random bit numbers entered into the first, X register. The random bit pattern is transmitted along with a video signal. The coordinates of the scanning spot are determined by the instantaneous content in the shift registers. Similar serially connected shift registers are used at the receiver, and the random bits, which are transmitted along with a video signal, are applied to the first of them. The coordinates for the current point to be scanned, as determined by the contents of the transmitting X and Y registers, are derived from the previous coordinates by shifting the complete contents of the X and Y shift registers one place to the right, losing the least significant bit in the Y register and injecting a random bit to the left or most significant location in the X register. After a number of shifts equal to the combined bit lengths of the X and Y registers (16 bits, for example) the receiver will be in synchronization with the transmitter no matter what the original content of the registers of the receiver.

U.S. Pat. No. 4,222,076, entitled "Progressive Image Transmitting", issued to Knowlton on Sep. 9, 1980, such patent disclosing a gray-scale image progressively transmitted over a narrow-band channel after the gray-scale values of all pictures elements (pixels) have been formatted into a hierarchial structure of picture subdivisions of successive sizes from entire image down to basic element values. Each formatted value is encoded as an approximate average of paired values. Transmission involves sending the primary value, representing the overall gray-scale magnitude, and following with successively split image values so that the entire image can be reconstructed at a receiver in progressively finer detail until the ultimate image results. The coding is nonredundant and full reconstruction is accomplished by transmitting the same number of bits that are required to send the image pixel-by-pixel and line-by line with the difference that an intermediate version can supply enough image detail for recognition. Unwanted images can be aborted at any intermediate stage, thus saving overall transmission time and effecting an equivalent picture compression when many images need to be examined in rapid succession.

U.S. Pat. No. 4,468,708. entitled "Combined Data Rate Reduction System", issued to Coleman, Jr. on Aug. 28, 1984, and discloses a method and apparatus for performing a reduction of the data rate of data stream for transmission through a transmission channel or recording and for subsequently reconstructing the original data stream upon receipt or during reproducing. The method and apparatus utilizes a combination of two processes, one of which eliminates or drops digital samples from the data stream to reduce the data rate for transmission and which subsequently reconstructs the original data stream using the unaltered and recovered digital samples to generate an interpolated value for each of the samples that had been dropped. The second process utilizes differential pulse code modulation for reducing the number of data bits per sample before sending the data stream through the transmission channel and for subsequently restoring the data to its original multi-bit form.

U.S. Pat. No. 4,628,344, entitled "Method and Apparatus for Encoding and Decoding Video", issued to Glenn on Dec. 9, 1986, such patent disclosing a method and apparatus for compatible transmission of high definition television signals in which existing low definition television receivers receiving the composite low and high definition transmission signal would display a low-definition television picture not inferior to present pictures, while a high resolution television receiver would receive the same signal and display a high definition picture. The system transmits low resolution video information at conventional frame rates, say 30 frames per second, while transmitting high resolution video information at a lower frame rate. The low and high definition video signals are derived in one embodiment by summing and averaging pixel luminance values, and subtracting the total of pixel values in some of the pixels in a group and the total of the pixel values of other pixels in the group. In another embodiment, the low and high definition signals, transmitted at regular and low frame rates, respectively, are derived by electronic processing of the video signal to produce signals representative of the low and high spatial frequencies, respectively, of the image to be transmitted.

U.S. Pat. No. 4,633,296, entitled "Omission and Subsequent Estimation of Zero Sequence Coefficients of Transformed Digitized Images to Facilitate Data Compression", issued to Cham et al, on Dec. 30, 1986, and discloses a method of transmission or storage of a television picture which involves dividing it into a plurality of blocks, subjecting them individually to a two-dimensional unitary transformation, transmitting or storing the transform coefficients and reconstructing the original blocks by the use of the inverse transformation. To reduce the data rate, the zero frequency (D.C.) coefficient is omitted for most or all the blocks, and the mean levels of the reconstructed blocks are adjusted to reduce visible brightness changes between them.

U.S. Pat. No. 4,672,444, entitled "Method for Transmitting a High-Resolution Image Over a Narrow Band Communication Channel", issued to Bergen et al, on Jun. 9, 1987, and discloses an image transmission method which analyzes the spatial-frequency spectrum of a high-resolution image into a low-pass remnant sub-spectrum band having a nominal high-frequency cutoff below that of one or more other spatial frequency bands, and separately transmitting each band, starting with the remnant band, over a narrow-band communication channel from a transmitter to an image display at a remote receiver.

U.S. Pat. No. 4,694,336, entitled "Digital Data Transmission Method", issued to Keesen, et al, on Sep. 15, 1987, such patent disclosing a method for transmitting digital video signals wherein spectral values of a scanned scene matrix are sorted according to magnitude, and the magnitudes of the spectral values then transmitted in succession, beginning with the greatest value. If the spectral values have been sorted according to magnitude, the magnitude of a spectral value always provides preinformation as to the magnitude of the next following spectral value.

U.S. Pat. No. 4,703,348, entitled "Picture Transmission System Using Secondary Differential Variable Sampling Rate Coding", issued to Yuasa et al, on Oct. 27, 1987, and discloses a picture transmission system which is adapted to code picture data by a variable sampling rate coding system to transmit the same. Picture data are stored in a frame memory of a transmission area so that differential values between that data and predictors from a predictive circuit are obtained by a subtracter and compression-coded by a variable sampling rate compression circuit for transmission. The compression-coded differential values are expansion-decoded by a variable sampling rate expansion circuit so that original differential values are supplied to an adder, which adds up the differential values with predictors, to produce predictors for subsequent sampling points. In a receiving area, transmitted codes are expansion-decoded by a variable sampling rate expansion circuit, so that the decoded values are added up with predictors from a predictive circuit by an adder to output the original picture data. Preposition prediction and variable sampling rate decoding are thus combined to enable, in the receiving area, automatic correction of compression/expansion errors caused in the transmission area.

In such prior art methods, when utilizing low bandwidth transmission media, a long time is required to send even a still image, with a full motion real time video image being highly impractical. The video transmission of color images is likewise highly impractical, and transmission of any image is prone to interference and distortion. present prior art attempts at video transmission are incompatible with existing video transmission systems, and the expansion of prior art system capabilities are impractical or non-existent.

In accordance with an aspect of the invention, it is accordingly an object of the invention to provide a new and improved method and apparatus for enabling high bandwidth information to be transmitted nearly instantaneously via low bandwidth media (or stored) with virtually no degradation of quality.

SUMMARY OF THE INVENTION

The foregoing and other objects of the invention are accomplished by providing a method and apparatus for transmitting and/or storing a modulated signal via a medium whose bandwidth is less than the signal's bandwidth. The modulated signal is first broken into segments or sampled in discrete finite equal increments of time. Within the segment, the analog waveform is converted to digital elemental representations, such as by analog to digital conversion at a predetermined sampling rate, whereupon the analog amplitudes are converted to a sequence or group of a given number of elements of digital values. The digital values are expressed as numeric values. The number of numeric values within the sequence is selected as a function of the bandwidth of the original modulated signal. In essence, this sequence is a group of digital form numerical values, the quantity (or number) of the group being determined by the analog signal's bandwidth within a pre-selected finite unit of time. The group is then treated as one complete beginning-to-end sequence representing that finite time unit, and entered into electronic memory storage. In a processor, a mathematical formula is executed to convert the numerical sequence of the group into a single integer and a key number(s), the resulting expression being unique to the sequence. These integers are then transmitted, sequentially, in digital form, via low bandwidth mediums. Alternatively, the integers may be stored for subsequent processing. Another matching, or inverse, formula is used to reconstruct the sequence from the integer and key(s), which is then read in order, and in real time, to recreate an exact, defect-free duplicate of the digital waveform. This digital waveform is then converted to an analog modulated signal output.

Other objects, features and advantages of the invention will become readily apparent from a reading of the specification, when taken in conjunction with the drawings, in which like reference numerals refer to like elements in the several views.

DESCRIPTION OF THE PREFERRED EMBODIMENT

Figure 1:
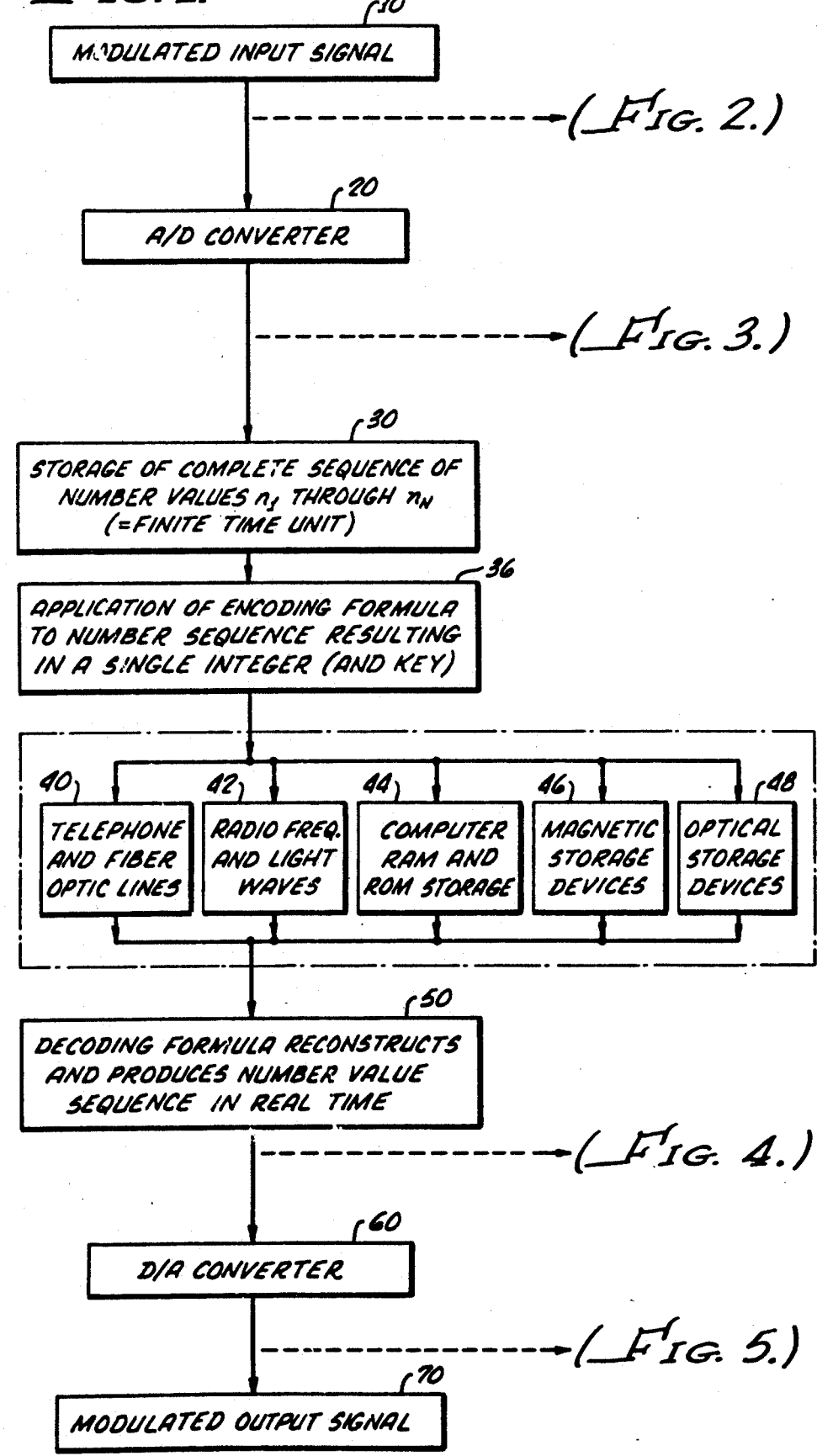
FIG. 1 is a flow diagram of a system illustrating the method and apparatus for bandwidth reduction and reconstruction of a modulated signal according to the invention.

Referring now to the drawings, and particularly to FIG. 1, there is shown a flow diagram of the method and apparatus according to the invention, in which a modulated input signal 10 is processed, via bandwidth reduction methods, and reconstructed to provide a faithful recreation of the original modulated signal. The signal 10 may be, for example, a high bandwidth modulated video signal, such as a signal at a frequency of about 4.5 MHz. In accordance with the present invention, the discussion will proceed with reference to utilizing high bandwidth television signals as the original signal, and the utilization of telephone lines as the transmitting low bandwidth media, and the use of RAM or ROM memory, or magnetic media such as tape as the low bandwidth storage medium.

In accordance with the invention, the method decreases the bandwidth required for transmitting television signals from 4.5 megahertz to less than 3 kilohertz, permitting ordinary telephone communication channels to be used for transmitting television signals. For ease of discussion, the waveforms and graphical depictions of FIGS. 2 through 5 are oriented relative to the block diagram of FIG. 1, with broken arrows for certain points on FIG. 1 pointing to the waveform or graphical depiction of FIGS. 2 through 5 corresponding to the form of the signal at that point.

Figure 2:
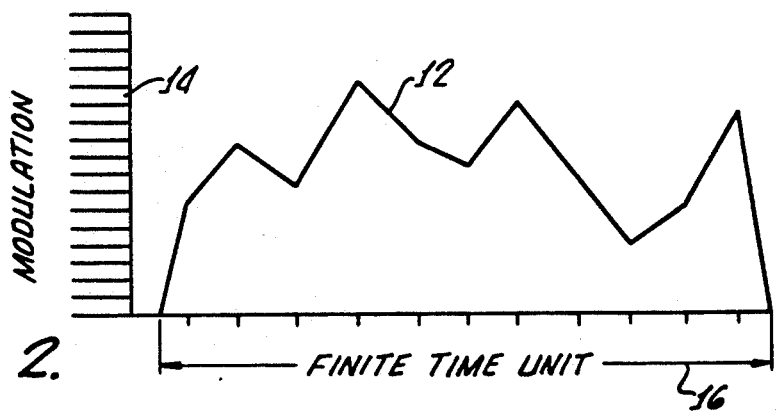
FIG. 2 is a waveform of a modulated input signal to the system of FIG. 1.

The modulated analog input signal 10 is shown graphically in FIG. 2, wherein the waveform 12 is depicted on a horizontal time scale and a vertical amplitude or modulation scale 14. The modulation scale 14 represents one of a number of different parameters such as video brightness voltage or audio amplitude. For purposes of discussion, the waveform segment 12 is depicted relative to a horizontal scale labeled "finite time unit" 16. The unit of time 16 is determined by the considerations of the bandwidth of the signal source utilized in the embodiment; video, for example, utilizes about 1/60 of a second to generate one scan of an image, with this time corresponding to one field of raster. The finite time unit 16 to be utilized for the waveform segment 12 may be, for example, a fraction of that time such as the time necessary to scan one line of the image. The bandwidth of the signal will also determine the number of sample points within the finite time unit 16, that is, the number of elements selected within the unit of time 16.

Figure 3:
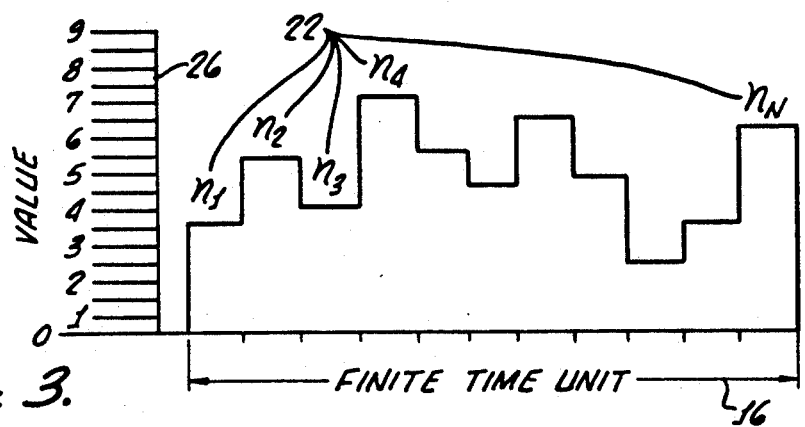
FIG. 3 is a graphical depiction showing the elements of a digital conversion of the waveform of FIG. 2 for enabling derivation of a unique numerical representation of the waveform for transmission.

Referring again to FIG. 1, this modulated signal 10 is converted to a digital format, via analog to digital converter 20. The result of this conversion is depicted in FIG. 3, wherein there is a sequence or group 22 of digital elemental representations, designated $n_1, n_2, n_3, n_4, \ldots, n_N$, as viewed from left to right, with each having a value corresponding to a number on the vertical scale 26. The finite time unit 16 corresponds to that of the waveform 12, with the vertical scale 26 being set forth in decimal numeric values "0" to "9", each numeric value corresponding to an arbitrary amplitude for the particular element of the digital waveform segment. These values shown as arbitrary whole integers from 0 to 9 are by way of example and for ease of explanation. The actual values for the vertical scale 26 are determined in a manner which is based on the modulation resolution requirements of the particular embodiment. The vertical scale 26 depicted in FIG. 3 is an arbitrary scale, that is the numeric values depicted are arbitrarily selected to correspond to the maximum anticipated amplitude of the digital elements of the waveform segment. The spacing or divisions, however, are preferably of consistent or predictive values, such as equal spacing or spacing on a known scale, such as logarithmic or exponential.

This analog to digital conversion step is unnecessary if the input signal is already in digital form as from a computer, or digitally sampled audio or video. These elements are then temporarily stored as depicted in block 30 as a sequence of numeric values $n_1$ to $n_N$. The block 30 may represent a memory storage device, such as, for example, a computer RAM, which then stores the entire group or sequence of numeric values, in order, for the elements $n_1$-$n_N$ derived in the particular finite time unit 16.

The next block 36 includes a processor which, in accordance with a predetermined algorithm, generates, from the sequence of digital numeric values, an expression which is unique to the particular sequence of numeric values. The expression may be a single integer or a single integer and one or more keys. The algorithm to be employed must be capable of taking a sequence of positive integers $n_1, n_2, n_3, n_4, \ldots, n_N$, and, from that sequence, find a number which uniquely represents each such sequence as a single positive integer "n". The formula must also have an inverse, that is, a corresponding formula which will calculate, from the single positive integer "n", the original sequence $n_1, n_2, n_3, n_4, \ldots, n_N$. In other words, there are two aspects to the algorithms. In the first instance, only one number "n" must result when a given order of a given number of numerical values are presented for the finite time unit. In the other instance, that is within the block designated 50, only one given order or sequence of a number of numerical values within the finite time unit must result from the unique number "n". The correspondence between $n_1, n_2, n_3, n_4, \ldots, n_N$ and "n" must be one-to-one, that is, no two different sequences must produce the same representation "n", and no two different representations will result in calculation of the same initial sequence.

In accordance with the present invention, the terms and notations to be utilized in discussion of the algorithm are as follows:

$\{n_i\}_N$ is used to denote the sequence $n_1, n_2, n_3, n_4, \ldots, n_N$, where "N" is the number of terms in the sequence $f(\{n_i\}_N)$ is be used to denote the formula which produces a single-integer representation from the sequence $\{n_i\}_N$ $f^{-1}(n)$ is used to denote the "inverse" formula which produces the sequence $\{n_i\}_N$ from the representing integer "n"

The essence of the formulae results in forms of f and $f^{-1}$ so that for all sequences, $f^{-1}(f(\{n_i\}_N)) = \{n_i\}_N$.

The radix representation theorem for sequences of positive integers of any length whose terms are all less than a fixed radix "b": (usually called the "base" of the representation) is stated as follows:

Given $\{n_i\}_N$ and a radix "b" (positive integer) such that—$0 < n_i < b$: For each term of the sequence $\{n_i\}_N$ the "radix-b representation" (representation to the base "b") is specified as follows:

$$n = n_1 + n_2 \cdot b + n_3 \cdot b^2 + \ldots n_N \cdot b^{N-1} \qquad (1)$$

This is calculated by recursive formulas as follows:

$$n_i = n_N \text{(initial step)} \quad (2)$$

$$n_k = n_{N-k+1} + b \cdot n_{k-1} \quad k=2,3,\ldots,N \quad (3)$$

This is repeated for k=2, 3, . . . , N; the last step is $$n_N = n_1 + b \cdot n_{(N-1)} \quad (4)$$
$$= n_1 + b \cdot n_2 + b^2 \cdot n_3 + \ldots + b^{N-1} \cdot n_N \quad (5)$$

This process specifies the formula $n = f(\{n_i\}_N)$

The inverse function is specified as follows: given "n", the radix-b sequence which "n" represents ("n" is represented to the base "b") is as follows:

$$b^{(0)} = n \text{ (initial step)} \quad (6)$$

$$b^{(k)} = INT[b^{(k-1)}/b] \quad (7)$$

wherein the notation INT[X] denotes, for any positive number X, the integer part of X, so INT[X/Y] is the result of dividing X by Y and discarding the fractional part of the remainder.

Next $\quad n^{(k)} = b^{(k-1)} - b \cdot b^k \quad (8)$

These two steps are repeated N times for k=a, 2, . . . , N. The "radix theorem" says that if "n" is formed from $\{n_i\}_N$ by the representation formula f, then $$n^{(1)} = n_1 \quad (9)$$
$$n^{(2)} = n_2 \quad (10)$$
.
.
$$n^{(N)} = n_N \quad (11)$$

This specifies the inverse function, that is $f^{-1}(n)$. This process will stop automatically after N steps, since $b^{(N)}$ is always zero.

In the application of the above formula described in formulae (1) through (5), and its inverse, set forth in formulae (6) through (11), as part of the algorithm, and in order to result in uniqueness of the resulting expression, the "base" is selected to be greater than the largest value assigned to the vertical scale 26 of the digital values $n_1, n_2, n_3, n_4, \ldots, n_N$ of curve 22.

By way of example, in the waveform 22 of FIG. 3, the maximum value depicted on the vertical scale 26 is "9". With the formulae above, a limiting factor is, therefore, that the base must be 10 or greater. This is necessary to insure that, in accordance with the radix representation theorem, the necessary conditions of the algorithm, and its inverse, are met, that is, in the first instance, to have a first formula which uniquely represents each sequence of numeric values of $n_1, n_2, n_3, n_4, \ldots, n_N$ as a single positive integer "n", and, in the inverse instance, to calculate, from that single positive integer "n", the original sequence $n_1, n_2, n_3, n_4, \ldots, n_N$. The correspondence between $n_1, n_2, n_3, n_4, \ldots, n_N$ and "n" must be one-to-one, that is, no two different sequences must produce the same representation "n", and no two different representations will result in calculation of the same initial sequence.

By way of example, and applying the formulae above given, assuming a digital waveform segment, similar to waveform 22, but having only four elements within the finite time segment 16, with the elements, in sequence, having values such as 2, 8, 5, and 4 (that is, values on the vertical scale 26 of FIG. 3), a base of "10", for example can be utilized. In this sample, any number greater than "8" may be utilized for the base ("8" being the largest number in the sequence 2, 8, 5, 4).

In accordance with this group or sequence of numeric values, in this example, the following exist:

$$b=10; \{n_i\}_N = 2,8,5,4; \text{ and } N=4$$

where "b" is the base; $\{n_i\}_N$ is the sequence of numeric values; and "N" is the number of numeric values within the sequence.

Therefore: $n_1=2; n_2=8; n_3=5; n_4=4$

Applying formula (1), this gives:

$$n = f(\{n_i\}_4) = n_1 + n_2 \cdot b + n_3 \cdot b^2 + \ldots n_N \cdot b^{N-1}$$

$$n = f(\{n_i\}_4) = 2 + (8 \cdot 10) + (5 \cdot 100) + (4 \cdot 1000)$$

$$n = 4,582$$

Utilizing recursive calculation, the following results:

$$n_{(1)} = n_4$$

$$n_{(2)} = n_3 + 10 \cdot n_{(1)} = 5 + 10 \cdot 4 = 45$$

$$n_{(3)} = n_2 + 10 \cdot n_{(2)} = 8 + 10 \cdot 45 = 458$$

$$n_{(4)} = n_1 + 10 \cdot n_{(3)} = 2 + 10 \cdot 458 = 4582$$

With either form of calculation, the resulting integer "n" (which is 4,582 in the above example) uniquely identifies a sequence of four numeric values 2, 8, 5, 4.

In accordance with the invention, the unique single integer "n" is calculated in the block designated 36. If necessary, a key may be assigned to the integer within the block 36 to identify its position, or time sequence, within the video frame or other grouping of data from the modulated input signal 10. As a basic example, a simple incrementing means may be utilized, wherein, as each segment is received, an increment by one operation is performed to insert a key in front of the integer so calculated.

This integer "n" is then ready for processing in one or more utilization devices or systems, such as transmission or storage. For example, the unique integer "n" and key, or keys, can then be transmitted through a lower bandwidth medium such as telephone or fiber optic lines 40, or even ordinary wires. The integer "n" and key, or keys can also be transmitted through radio frequencies and light wave devices 42. Obviously, the integer "n" and key, or keys can be transmitted in multiples through mediums of equal or greater bandwidth when a multiplexing mode is desired. The integer and keys can be concurrently stored with transmission or by itself via computer RAM or ROM devices 44, or with magnetic storage devices 46 such as reel tape, cassettes, and floppy or hard disks, or with optical storage devices 48, such as compact discs. In any event, such storage devices of present construction, for the most part, have storage capability for signals of bandwidth lower than the original modulated signal 12.

From whatever transmission or storage media, the inverse is then calculated in the block designated 50, to recreate the sequence represented by the unique single integer "n" (4,582, in the above example). This is accomplished by the formulae (6) through (11) above given.

The inverse function is specified as follows: given "n", the radix-b sequence which "n" represents ("n" is represented to the base "b") is as follows:

$b^{(0)} = n = 4,582$ (initial step)

$b^{(1)} = INT[b^{(0)}]/b] = INT[4582/10] = 458$ $n^{(1)} = 4582 - (458*10) = 2 = n_1$ $b^{(2)} = INT[458/10] = 45$ $n^{(2)} = 458 - (45*10) = 8 = n_2$ $b^{(3)} = INT[45/10] = 4$ $n^{(3)} = 45 - (4*10) = 5 = n_3$ $b^{(4)} = INT[4/10] = 0$ $n^{(4)} = 4 - (0*10) = 4 = n_4$

Thus for the inverse function, that is, $f^{-1}(f(\{n_i\}_N)) = \{n_i\}_N$, the resulting sequence 2, 8, 5, 4 has the unique radix-10 representation 4,582 and the integer 4,582 uniquely produces the sequence 2, 8, 4, 5.

It is to be understood that this is a relatively simple example of a sequence of only four numeric values, none of which is greater than "10", i.e., the base or radix-10 utilized. For greater magnitudes on the vertical scale 26 of FIG. 3, obviously, as discussed above, a greater base number will be used, and correspondingly, as the number "N" of samples within the waveform 22 increases, the number of calculations to be performed in both formulae also increases.

Taking a more complex example, given a sequence of the following numeric values 7, 41, 12, 52. a base is selected which is greater than the largest numeric value, that is, 52. Utilizing a "base" of 84, the following results:

$b = 84; n_1 = 7; n_2 = 41; n_3 = 12; n_4 = 52;$ and $N = 4$.

$n = 7 + (84*41) + [(84)^2*12] + [(84)^3*52] = 30,908,731$

This results in a unique integer "n" of 30,908,731 which represents the original sequence of 7, 41, 12, 52.

The inverse function derivation is then:

$b^{(0)} = n = 30,908,731$ $b^{(1)} = INT[b^{(0)}]/b] = INT[30,908,731/84] = 367,961$ $n^{(1)} = 30,908,731 - (367,961*84) = 30,908,731 - 30,908,724 = 7 = n_1$ $b^{(2)} = INT[367,961/84] = 4,380$ $n^{(2)} = 367,961 - (4,380*10) = 367,961 - 367,920 = 41 = n_2$ $b^{(3)} = INT[4,380/84] = 52$ $n^{(3)} = 4,380 - (52*84) = 4,380 - 4,368 = 12 = n_3$ $b^{(4)} = INT[52/84] = 0$ $n^{(4)} = 52 - (0*84) = 52 = n_4$

Figure 4:
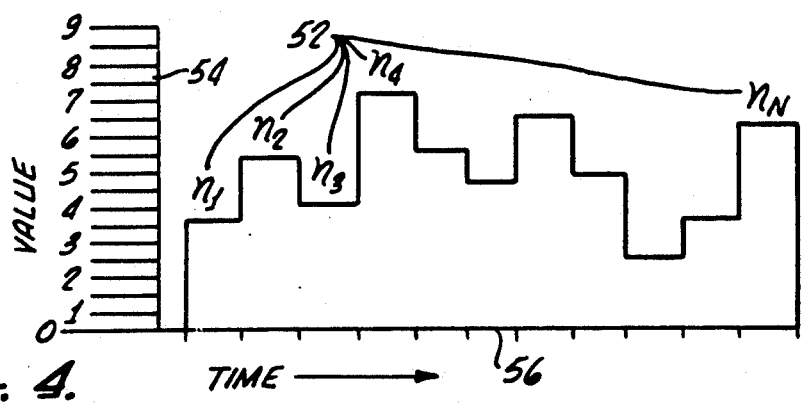
FIG. 4 is a graphical depiction of the reconstructed digitally converted transmitted waveform.
Figure 5:
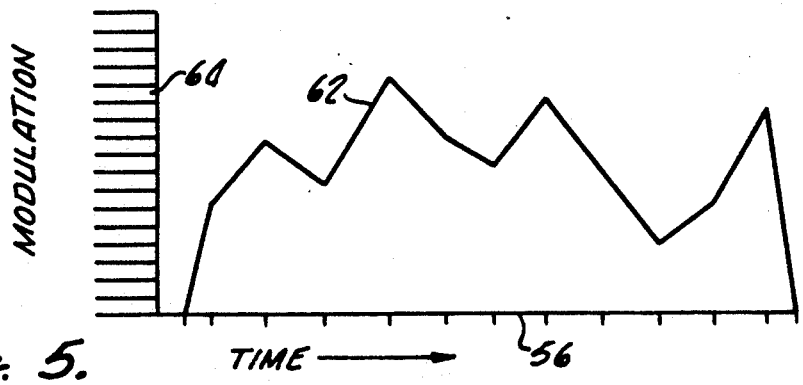
FIG. 5 is a waveform of the reconstructed modulated signal at the output of the system of FIG. 1.

In any event, with the integers transmitted to a receiving system, the integers "n" are decoded at 50, with the corresponding waveform depicted in FIG. 4. At the receiving system, the vertical value scale 54 corresponds to that of the transmitted scale 26 of FIG. 3, with the vertical values of each of the elements 52 (that is, $n_1, n_2, n_3, n_4, \ldots, n_N$) corresponding to the vertical values of each of the elements in the original waveform of FIG. 3. These values are then processed in digital to analog converter 60 in sequence (according to key, if used, or according to time received), to produce the waveform 62 of FIG. 5, with the values on the vertical scale 64 corresponding to the values on the vertical scale 14 of FIG. 2, that is, the modulated signal is recreated at 70.

If the end result is to be used in the digital mode, the output of decoder 50 may be sent to an input stage of a digital utilization device. Otherwise, the digital to analog converter 60 changes the number values 52 to modulation points which become an analog waveform 62 with a modulation scale 64 that matches the original input scale 14. The result is an identical output signal 70 to that of the input signal 10.

In accordance with the instant invention, there has been shown and described a method and apparatus for enabling conversion of high bandwidth signals into unique integer representations for storage or transmission via low bandwidth media. In accordance with the invention, the high bandwidth frequency can be increased while using the same or slightly modified frequency of the medium—that is, the system is easily expandable. If the original modulated source is video, the integers (and keys, if needed) can represent full color, with high quality audio output. The instant invention enables use of tapeless, all-electronic devices for information storage and retrieval, with high information storage.

In summary, for video transmission, the method of signal bandwidth reduction according to the present invention comprises the steps of converting the analog brightness values of 157,500 to 315,000 or so successive pixels sequentially scanned in a frame of a television image to a sequence of digital numeric values to form a single unique number, which is then sent over a lower bandwidth transmission channel such as a telephone line in the form of an operating base plus a "key" number. Alternatively, the frame of video information can be converted a line at a time, or converted by use of any other convenient finite time unit. At the receiving end of the transmission channel, a microprocessor applies a decoding mathematical equation to the number, using the key to reconstruct the entire sequence of pixel brightness levels, which are then stored and sequentially output as a video luminance signal to a television picture tube.

It is to be understood that modifications may readily be made in accordance with the present invention. For example, other, different and more efficient algorithms may be formulated to accomplish the same result. Multi-stage keys may be utilized to pare the single unique integer down to manageable size. Algorithms may be constructed to operate with no key or no transmitted key, or even multiple keys for security reasons.

Each integer can be coded, with the code sent at regular intervals to instruct the receiving-end processor as to the type of signal being transmitted, that is video, HDTV, audio, etc.. In this this manner, multiplexing may be utilized for transmission and reception by utilization of the code for instructing the receiving processor how to process and separate the different types of incoming signals. Color video may be transmitted simultaneously with a chrominance system operating similarly to luminance video modulation transmission, with hue and saturation values assigned a number value at each sample point. In addition, high quality multichannel audio may be transmitted the same way.

While the finite time unit has been described with reference to 1/60 of a second, corresponding to a frame of video signal, it is to be understood that any other convenient finite time unit may be employed, such as a time unit corresponding to a line of video, or a fixed fraction of a line. In any event, the finite time unit and the number of sampled elements within the sequence will, in large part, be determined by the bandwidth of the original modulated signal 10, the processing time required for the algorithm utilized, and the subsequent method of utilization of the algorithm processor output.

In accordance with the embodiment hereinabove shown and described, the instant invention enables nearly instantaneous transmission, with full motion, color and images virtually identical with imaging input device (e.g., camera, recorder), with little or no signal degradation.

Commercial stations can simultaneously broadcast HDTV along with NTSC in the same channel space, thus providing compatibility with existing systems. In addition, the system is expandable. Since the end transmission product is a single integer and one or more keys, greater resolution can be added to same system, with a wider and higher resolution contrast range. A full spectrum multi-channel audio system may also be effected.

The invention applies equally to all types of modulated analog signals, be it video or audio, and aspects of the invention may equally be utilized with data which is digital at its inception, such as digital audio sources, or digital video sources. With any such source signals, multiplexing may be conveniently employed through the transmission media. For storage, magnetic media, because of low bandwidth digital requirements, can be of low, or even poor quality, with minimal precision transports, and transfers and duplicates can be done at high speed. Depending on the application, that is, the time of usage of the stored single integers, ROM or RAM memories can serve as storage devices.

While there has been shown and described a preferred embodiment, it is to be understood that various other adaptations and modifications may be made within the spirit and scope of the invention.

What I claim is:

1. A method of converting a modulated analog signal to a signal suitable for storage or transmission through a medium whose bandwidth is less than the bandwidth of said modulated signal comprising the steps of:
    defining a finite time unit which is, at least in part, determined by the frequency bandwidth of the modulated signal;
    processing successive segments of said modulated signal, with each such segment occurring within a successive one of said finite time units, said processing including:
        sequentially converting each of said segments into a sequence of a predetermined number of successive digital elemental representations, said predetermined number being determined by the frequency bandwidth of the modulated signal; and
        calculating a plurality of integers, each of said plurality of integers uniquely corresponding to each of said respective sequences.

2. The method according to claim 1 further including the step of successively storing each of said integers.

3. The method according to claim 1 further including the step of transmitting each of said integers through a medium which has a bandwidth less than the bandwidth of said modulated analog signal.

4. The method according to claim 3 further including the steps of reconstructing, from the sequence of transmitted integers, said sequence of said predetermined number of successive digital elemental representations, and converting each of said sequences into analog values representative of said analog modulated signal.

5. The method according to claim 2 further including the steps of reconstructing, from the stored integers, said sequence of said predetermined number of successive digital elemental representations, and converting each of said sequences into analog values representative of said analog modulated signal.

6. The method according to claim 1 further including the step of assigning at least one key to each of said integers.

7. A method of transmitting a modulated analog source signal through a medium whose bandwidth is less than the bandwidth of said source signal comprising the steps of:
    converting successive segments of the analog modulated amplitudes of said source signal into a time sequence of a predetermined number of digital numerical values, said predetermined number being determined by the signal bandwidth frequency contained within a finite time unit;
    calculating a plurality of integers, each of said plurality of integers uniquely corresponding to each of said respective sequences;
    transmitting each of said integers through the lower bandwidth medium;
    reconstructing, from each of said integers, the sequence of said predetermined number of digital numerical values unique to said integer; and
    converting successive sequences of digital numerical values into successive segments representative of segments of said analog modulated source signal.

8. The method according to claim 7 wherein said source signal is a video signal and said lower bandwidth medium is a telephone transmission system.

9. The method according to claim 7 wherein said source signal is a high quality audio signal and said lower bandwidth medium is a telephone transmission system.

10. A method of transmitting a modulated analog signal through a medium whose bandwidth is less than the bandwidth of said signal comprising the steps of:
    converting a segment of the modulated analog amplitudes of said signal into a sequence of a number of digital numerical values, the number being determined by the signal bandwidth frequency contained within a finite time unit;
    entering said sequence into electronic memory;
    processing said sequence from said memory in accordance with a formula that reduces said sequence to a single integer and at least one key;
    transmitting said single integer and said at least one key through a medium whose bandwidth is less than the bandwidth of said signal;
    processing said integer and said at least one key in accordance with another formula that reconstructs said sequence of a number of digital numerical values from said single integer and said at least one key; and converting said sequence of digital numerical values into a representation of said modulated analog signal.

11. The method according to claim 10 further including the steps of repeating each of said steps for each successive segment of said source signal, wherein each successive segment occurs within the next successive finite time unit.

12. A method of storing and recovering a modulated analog signal via a storage medium whose bandwidth is less than the bandwidth of said signal comprising the steps of:

converting a segment of the modulated analog amplitudes of said signal into a sequence of a number of digital numerical values, the number being determined by the signal bandwidth frequency contained within a finite time unit;

entering said sequence into electronic memory;

processing said sequence from said memory in accordance with a formula that reduces said sequence to a single integer and at least one key unique to said sequence;

storing said single integer and said at least one key in said storage medium;

processing said integer and said at least one key in accordance with another formula that reconstructs said sequence from said single unique integer and said at least one key; and converting said sequence into a representation of said modulated analog signal.

13. The method according to claim 12 further including the steps of repeating each of said steps for each successive segment of said source signal, wherein each successive segment occurs within the next successive finite time unit.

14. A method of transmitting a modulated analog signal that has previously been converted to a digital format through a medium whose bandwidth is less than the bandwidth of the modulated signal comprising the steps of:

taking a segment of the digitally formatted signal as a sequence of a number of digital numerical values, the number being determined by the signal bandwidth frequency contained within a finite time unit;

entering said sequence into electronic memory;

processing said sequence from said memory in accordance with a formula that reduces said sequence to a single integer and at least one key unique to said sequence;

transmitting said single integer and said at least one key through a medium whose bandwidth is less than the bandwidth of the modulated signal;

processing said integer and said at least one key in accordance with another formula that reconstructs said sequence from said single integer and said at least one key; and utilizing said sequence as reconstructed, or converting said sequence into a representation of said modulated analog signal.

15. The method according to claim 14 further including the steps of repeating each of said steps for each successive segment of said digitally formatted signal, wherein each successive segment occurs within the next successive finite time unit.

16. A method of storing a modulated analog signal that has previously been converted to a digital format through a medium whose bandwidth is less than the bandwidth of the modulated signal comprising the steps of:

taking a segment of the digitally formatted signal as a sequence of a number of digital numerical values, the number being determined by the signal bandwidth frequency contained within a finite time unit;

entering said sequence into electronic memory;

processing said sequence from said memory in accordance with a formula that reduces said sequence to a single integer and at least one key unique to said sequence;

storing said single integer and said at lest one key in a storage medium whose bandwidth is less than the bandwidth of the modulated signal;

processing said integer and said at least one key in accordance with another formula that reconstructs said sequence from said single integer and said at least one key; and utilizing said sequence as reconstructed, or converting said sequence into a representation of said modulated analog signal.

17. The method according to claim 16 further including the steps of repeating each of said steps for each successive segment of said digitally formatted signal, wherein each successive segment occurs within the next successive finite time unit.

18. Apparatus for converting a modulated analog signal to a signal suitable for storage or transmission through a medium whose bandwidth is less than the bandwidth of said modulated signal, said apparatus comprising:

means for establishing a finite time unit which is, at least in part, determined by the frequency bandwidth of the modulated signal;

means for processing a plurality of successive segments of said modulated signal, with each of said segments occurring within a successive one of said finite time units, said processing means including:

means for sequentially converting each of said segments into a corresponding sequence of a predetermined number of successive digital elemental representations, said predetermined number of successive digital elemental representations, said predetermined number being determined by the frequency bandwidth of the modulated signal; and means for calculating a plurality of integers, each of said integers uniquely corresponding to each of said respective sequence.

19. The apparatus according to claim 18 further including means for successively storing each of said integers.

20. The apparatus according to claim 18 further including means for transmitting each of said integers through a medium which has a bandwidth less than the bandwidth of said modulated analog signal.

21. The apparatus according to claim 20 further including means for reconstructing, from the sequence of transmitted integers, the corresponding sequences of said predetermined number of successive digital elemental representations.

22. The apparatus according to claim 21 further including means for converting each of the sequences into analog values representative of said modulated signal.

23. The apparatus according to claim 19 further including means for reconstructing, from the stored single integers, the corresponding sequences of said predetermined number of successive digital elemental representations, and means for converting each of said sequences into analog values representative of said modulated analog signal.

24. The apparatus according to claim 18 further including means for assigning at least one key to each of said integers.

* * * * *